United States Patent [19]

Tomiwa

[11] 3,787,961

[45] Jan. 29, 1974

[54] CHIP-SHAPED, NON-POLARIZED SOLID STATE ELECTROLYTIC CAPACITOR AND METHOD OF MAKING SAME

[75] Inventor: Hiroshi Tomiwa, Osaka, Japan

[73] Assignee: Matsuo Electric Company, Limited, Osaka-fu, Japan

[22] Filed: June 19, 1972

[21] Appl. No.: 264,070

[52] U.S. Cl. .................................... 29/570, 29/580

[51] Int. Cl. ............................................ B01j 17/00

[58] Field of Search.................... 29/570, 580, 25.42

[56] References Cited

UNITED STATES PATENTS

| | | | |
|---|---|---|---|
| 3,193,418 | 7/1965 | Cooper et al. | 29/580 |
| 3,465,426 | 9/1969 | Baier et al. | 29/570 |
| 3,469,294 | 9/1969 | Hayashi et al. | 29/25.42 |
| 3,579,811 | 5/1971 | Matsuo et al. | 29/570 |

*Primary Examiner*—Charles W. Lanham
*Assistant Examiner*—W. C. Tupman
*Attorney, Agent, or Firm*—Eugene E. Geoffrey, Jr.

[57] ABSTRACT

A chip-shaped, non-polarized capacitor for use on printed circuit boards. It is formed from a metal laminate consisting of a layer of solderable material and a layer of film-forming material. The film-forming material is etched to provide islands and layers of metal oxide insulating material and a metal oxide semiconductor are applied thereto. A continuous cathode layer is formed over both semiconductor layers and a resin coating is applied over the cathode layer. The solderable layer is then etched to provide separate terminals.

5 Claims, 27 Drawing Figures

Figure 1A:
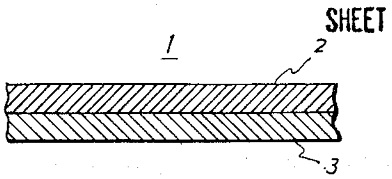

CHIP-SHAPED, NON-POLARIZED SOLID STATE ELECTROLYTIC CAPACITOR AND METHOD OF MAKING SAME

This invention relates to a novel and improved chip-shaped, non-polarized solid state electrolytic capacitor particularly suited for face-bonding to a printed circuit board and to an improved method for the manufacture thereof.

A capacitor to be used on a printed circuit board, such as a hybrid integrated circuit, is required to be as small as possible. Such a capacitor has been made by sequentially depositing a metal oxide dielectric layer, a method oxide semiconductor layer, and an electroconductive layer on a metal sheet. It is known that such capacitors can be produced in mass by executing the above mentioned deposition in a plurality of discrete areas of a large metal sheet and then separating these areas by cutting the sheet. However, such capacitors are generally polarized and, if one intends to provide a non-polarized capacitor, two such capacitors must be bonded back-to-back. The bonding process requires precise jigs and tools, and the procedure is troublesome and time-consuming so that the non-polarized capacitor is not only very expensive, but also rather large in size and unsuitable for face-bonding to printed circuits.

Therefore, an object of this invention is to provide a novel and improved structure for a chip-shaped, non-polarized solid state electrolytic capacitor which is well suited for use in face-bonding processes.

Another object of this invention is to provide an improved method for mass producing chip-shaped, non-polarized solid state electrolytic capacitors.

According to this invention, the chip-shaped, non-polarized solid state electrolytic capacitor includes a pair of flat terminal pads consisting of a solderable metal and disposed in closely spaced relationship and in the same plane, a pair of flat anode electrodes consisting of a film-forming metal and laminated on said terminal pads respectively, a metal oxide dielectric layer formed on the surface of each said anode electrode, a metal oxide semiconductor layer formed on the surface of said dielectric layer, an electroconductive cathode layer formed on said semiconductor layer, said cathode layers belonging to said pair of anode electrodes being continuous as a single layer, and a synthetic resin coating formed on said cathode layer.

The method of manufacturing this capacitor according to this invention includes the step of selectively etching a laminated metal sheet consisting of a first layer of film-forming metal and a second layer of solderable metal to leave at least a pair of discrete islands of film-forming metal as a pair of anode electrodes on the solderable metal layer, the step of forming at least one metal oxide insulating layer to cover said pair of anode electrodes, the step of forming at least one metal oxide semiconductor layer on said insulating layer, the step of forming a single electroconductive cathode layer on said semiconductor layer in common to said pair of anode electrodes, the step of pouring synthetic resin on said cathode layer to form a synthetic resin coating thereon, and selectively etching said solderable metal layer to leave at least a pair of discrete islands of the solderable metal disposed respectively on said pair of anode electrodes to serve as anode terminal pads.

These and other objects and features of this invention will become more evident from the following description with reference to the accompanying drawings.

Figure 1B:
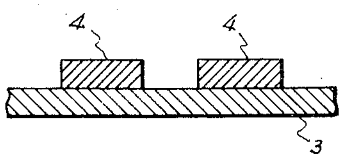
Figure 1C:
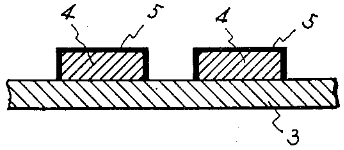
Figure 1D:
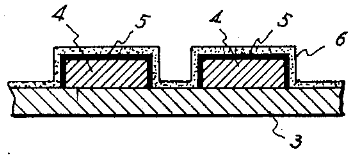
Figure 1E:
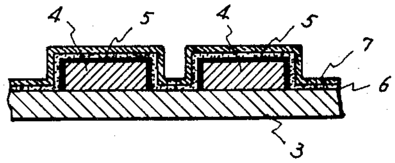
Figure 1F:
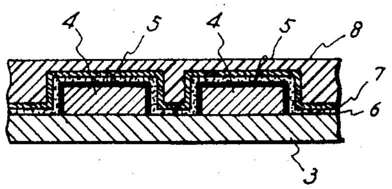
Figure 1G:
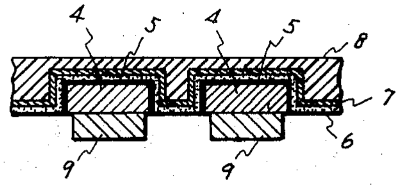
Figure 1H:
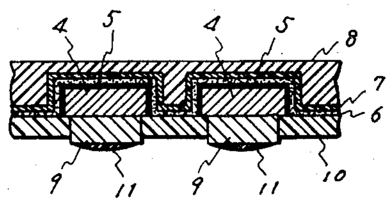
Figure 1I:
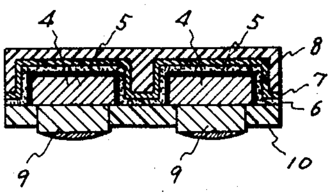
Figure 2:
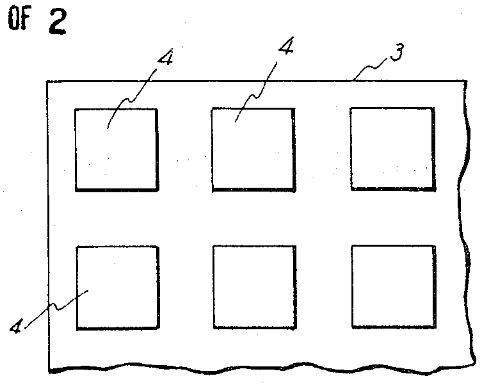
Figure 3:
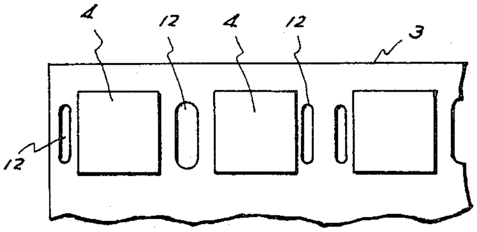
Figure 4A:
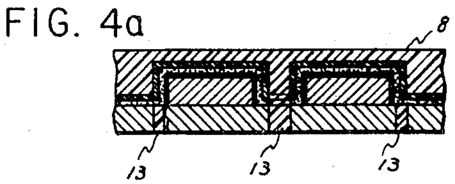
Figure 4B:
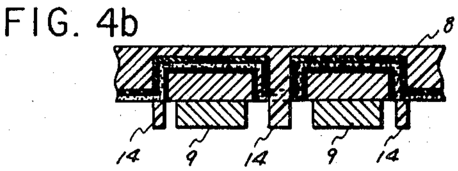
Figure 4C:
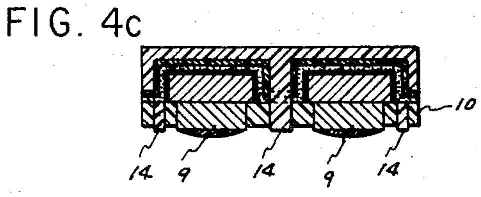
Figures 5A, 5B, 5C, 5D, 5E, 5F, 5G, 6A, 6B, 6C, 7, 8A, 8B:
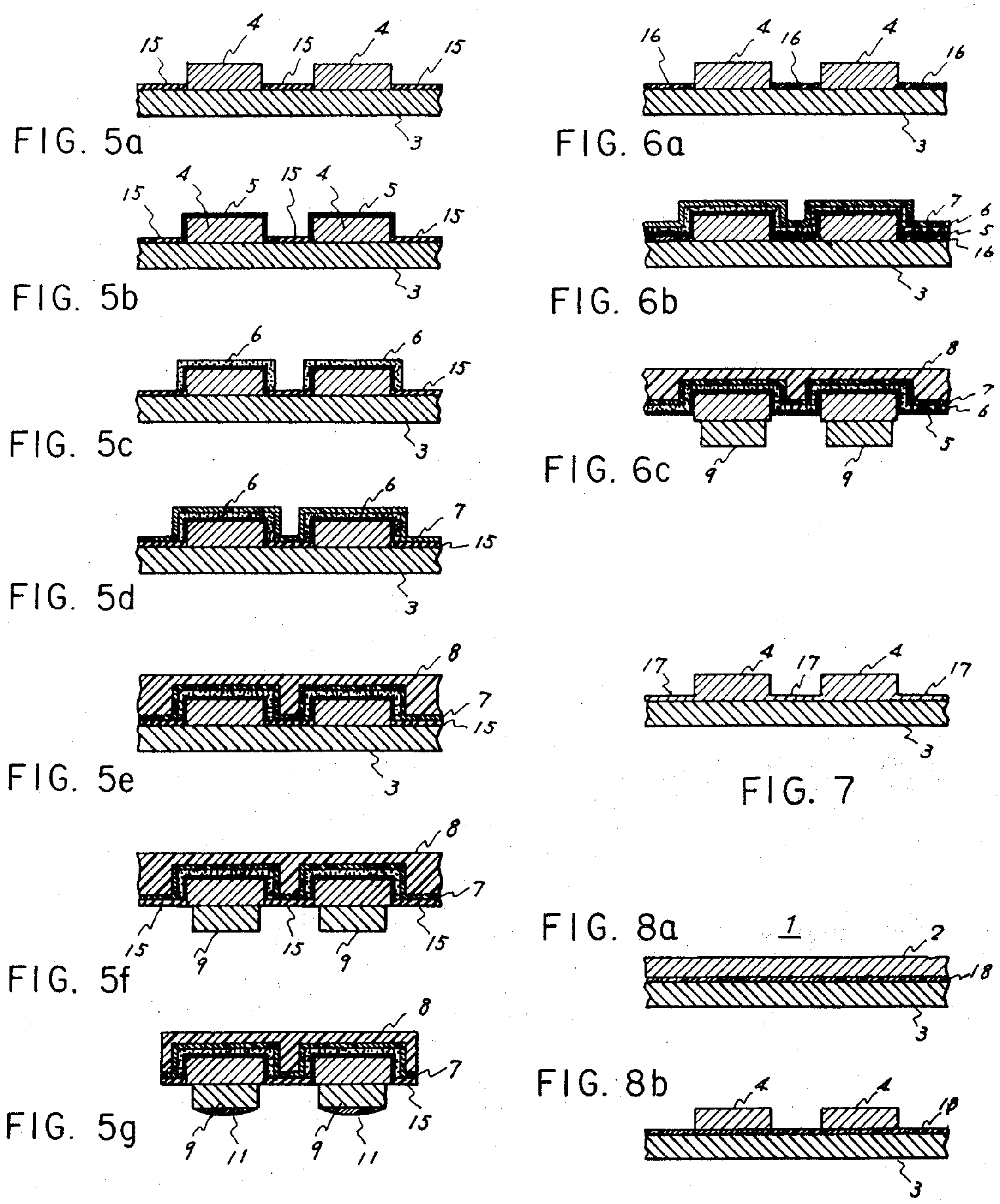

In the drawings:

FIGS. 1a–1i show cross-sectional views representing various steps of an embodiment of the method of this invention, FIG. 2 is a partial plan view representing one step of the embodiment of FIGS. 1a–1i, FIG. 3 is a partial plan view representing a step, corresponding to FIG. 2, of a modification of the method of FIGS. 1a–1i, FIGS. 4a–4c show cross-sectional views representing several steps of the modified method of FIG. 3, FIGS. 5a–5g show cross-sectional views representing various steps of another embodiment of the method of this invention, FIGS. 6a–6c show cross-sectional views representing steps of further embodiments of the method of this invention, FIG. 7 is a cross-sectional view representing a step of a modification of the method of FIGS. 6a–6c, and FIGS. 8a–8b show cros-sectional views representing a step of another modification of the method of FIGS. 6a–6c.

Throughout the drawings, like reference numerals are used to denote corresponding structural components.

Referring first to FIGS. 1a–1i representing a typical embodiment of the method of this invention, a laminated metal sheet 1 is provided and consists of a first layer 2 of so-called film-forming metal such as tantalum, titanium, aluminum or niobium, and a second layer 3 of solderable metal such as copper, nickel, iron or Kovar (trade name), as shown in FIG. 1a. The thicknesses of both layers may be about 0.5 millimeter, respectively, for example.

The first layer 2 is selectively etched to leave a pair of discrete islands 4 of the film-forming metal which serve as anode electrodes as shown in FIG. 1b. This process may be conveniently carried out by using a so-called photoresist masking and etching technique. Then, the anode electrodes 4 are oxidized by a conventional technique to form thin oxide dielectric layers 5 thereon as shown in FIG. 1c. This oxidation can be conveniently effeceed by an anodizing technique, but thermal oxidation may be utilized, as the occasion demands. The thickness of the oxide layer may be from a few to several thousand Angstroms, for example.

Then, a metal oxide semiconductor layer 6, such as a manganese dioxide layer, is formed on the oxide layers 5 as shown in FIG. 1d. This process may be conveniently carried out by utilizing electrolysis of a manganese sulfate solution or thermal dissociation of a manganese nitrate solution. The semiconductor layer 6 may be 10 or 20 to several hundred microns in thickness. Then, a single electroconductive cathode layer 7 is formed on the semiconductor layer 6 in common to both anode electrodes 4 as shown in FIG. 1e. The cathode layer 7 may be formed by spraying a graphite suspension or an electroconductive paint, or by utilizing other known metallization techniques.

In the next step, a suitable synthetic resin casting material is poured onto the cathode layer by a transfer molding technique to form a resin coating 8 as shown in FIG. 1f. Then, the solderable metal layer 3 is selectively etched by a technique similar to that used for forming the anode electrodes 4 to form a pair of terminal pads 9 respectively laminated to the anode electrodes 4. In order to protect the semiconductor layer 6 exposed by the etching of the terminal pads 9, a synthetic resin 10 is coated on the exposed semiconductor layer 6. Moreover, in order to facilitate soldering of the terminal pads 9, solder platings 11 may be provided on the faces thereof, as shown in FIG. 1*h*.

Although, in the drawings, only a pair of anode electrodes 4 constituting one capacitor element are shown, a number of anode islands may be formed by etching in rows and columns as shown in FIG. 2. In this case, after completing the above mentioned steps, the flat plate-like resin-molded structure, including a number of capacitor elements, are separated by cutting to provide individual chip-shaped, non-polarized solid state electrolytic capacitors as shown in FIG. 1*i*.

If, as shown in FIG. 3, holes 12 are appropriately bored in the solderable metal layer 3 after the anode electrodes 4 are formed by etching, the synthetic resin 8 flows in these holes as denoted by the numeral 13 in FIG. 4*a* and are left as projections 14 after etching the anode electrode pads 9 as shown in FIG. 4*b*. These projections 14 cooperate with the protecting resin coating 10 to prevent peeling of the resin coating 10.

FIGS. 5*a*–5*g* show a second embodiment of the method of this invention. According to this method, after the anode electrodes 4 are formed by etching on the solderable metal layer 3 as in the case of FIGS. 1*a*–1*i*, a suitable synthetic resin film 15 is formed on the exposed solderable metal layer by a masking and spraying method, for example, as shown in FIG. 5*a*. Then, oxide dielectric layers 5 and semiconductor layers 6 are sequentially formed by the same technique as in the case of FIGS. 1*a*–1*i* and shown in FIGS. 5*a* and 5*c*. In this case, however, the semiconductor layers 6 are separately formed on the respective anode electrodes 4 by electrolysis as shown in FIG. 5*c*, since the resin film 15 is non-conductive.

A cathode layer 7 and a resin coating 8 are then formed as shown in FIGS. 5*a* and 5*e* and, thereafter, the solderable metal layer 3 is selectively etched to form a pair of electrode terminal pads 9 as shown in FIG. 5*f*, as in the case of FIGS. 1*a*–1*i*. In this embodiment, however, the layer exposed by etching of the solderable metal layer 3 is the electrically insulating and mechanically strong synthetic resin layer 15. Therefore, the resin protection coating 10 of FIGS. 1*a*–1*i* becomes unnecessary. The completed capacitor is shown in FIG. 5*g*.

Referring to FIG. 6*a*, a plating 16 of film-forming metal is deposited instead of the resin film 15 of FIG. 5'a. In this case, a continuous oxide dielectric layer 5 is formed over both anode electrodes 4 by the same treatment as in the case of FIGS. 1*a*–1*i*, as shown in FIG. 6*b* and this dense and strong layer is exposed as shown in FIG. 6*c* when the metallic plating 16 is etched away together with the solderable metal layer 3. As the oxide layer 5 is well suited for protection of the semiconductor layer 6, a protecting layer is not required.

The same effect can be obtained by leaving a portion of the film-forming metal layer 2 as shown at 17 in FIG. 7 instead of the metallic plating 16 of FIG. 6*a* and etching away this portion 17 together with the solderable metal layer 3.

FIGS. 8*a*–8*b* show a modification proposed for the purpose of omitting the process of plating the film-forming metal layer 16 of FIG. 6*a* and removing the difficulty of controlling the thickness of the portion 17 of FIG. 7. In this embodiment, the laminated metal sheet 1 consists of three layers; a first layer 2 of first film-forming metal, a second layer 4 of solderable metal and a thin intermediate layer 18 of a second film-forming metal which has a lower etching speed than the first film-forming metal as shown in FIG. 8*a*. The succeeding steps of the methods of FIGS. 7 and 8*a*–8*b* are quite similar to those of the method of FIGS. 6*a*–6*c*.

It is of course understood that the above mentioned embodiments are given only for the purpose of illustration and many variations, modifications and changes can be made without departing from the scope of this invention. Although, in the drawings, the cathode layer 7 is applied over the whole area, it is rather desirable that the cathode layer is deposited only over the anode electrodes 4 and a channel area connecting the anode electrodes. Such limited desposition of the cathode layer 7 can be effected by utilizing a masking technique. The oxide layers 5 and semiconductor layers 6 on both anode electrodes may be either continuous or not as long as the cathode layer 7 is continuous over both anode electrodes. Lead dioxide and other metal oxide semiconductor materials may be used in place of the manganese dioxide layer 6. Although the terminal pad 9 is shown to be disposed within the bottom face of the anode electrode 4, it can be made as an elongated tab extending laterally from the side of the capacitor body by suitably selecting the etching pattern.

As described in the above, the method of this invention can be practiced very easily by using photoresist etching techniques and masking and deposition techniques which are well known in the field of semiconductor manufacture and there is no need for the application of mechanical force and heat which may destroy or deteriorate electric characteristics of the capacitor. Therefore, non-polarized electrolytic capacitors having improved and uniform characteristics can be manufactured in mass and at a relatively low cost in accordance with this invention.

What is claimed is:

1. A method of manufacturing chip-shaped, non-polarized solid state electrolytic capacitors, comprising the steps of selectively etching a laminated metal sheet consisting at least of a first layer of film-forming metal and a second layer of solderable metal to leave a plurality of pairs of discrete islands of said film-forming metal on said second layer of solderable metal, forming metal oxide dielectric layers on the surfaces of said islands, depositing metal oxide semiconductor layers on said dielectric layers, depositing an electroconductive layer on said semiconductor layers, said electroconductive layer being continuous at least across each said pair of islands, pouring synthetic resin on said electroconductive layer to form a continuous resin package on the etched side of said metal sheet, selectively etching said second layer of solderable metal to leave discrete islands of solderable metal respectively on the other surfaces of said discrete islands of film-forming metal, and severing said resin package along the boundaries of said respective pairs of islands to separate the individual capacitors.

2. The method, according to claim 1, wherein a synthetic resin film is formed on the surface of said second layer of solderable metal, which has been exposed by etching said first layer of film-forming metal, after said etching step.

3. The method, according to claim 1, wherein a film-forming metal is plated on the surface of said second layer of solderable metal, which has been exposed by etching said islands of film-forming metal, after said etching step, and said plating is etched away during the step of etching said second layer of solderable metal.

4. The method, according to claim 1, wherein a part of said first layer of film-forming metal is retained between said islands in the step of etching said first layer and is then etched away during the step of etching said second layer of solderable metal.

5. The method, according to claim 1, wherein said metal sheet further includes a third layer of film-forming metal between said first and second layers, the film-forming metal of said third layer has a lower etching speed than the film-forming metal of said first layer, said third layer being retained in the step of etching said first layer and etched away in the step of etching said second layer.

* * * * *